United States Patent
Lee et al.

(10) Patent No.: US 9,257,674 B2
(45) Date of Patent: Feb. 9, 2016

(54) ORGANIC LIGHT EMITTING DIODE DISPLAY AND MANUFACTURING METHOD THEREOF

(75) Inventors: So-Young Lee, Yongin (KR); Yoon-Hyeung Cho, Yongin (KR); Min-Ho Oh, Yongin (KR); Byoung-Duk Lee, Yongin (KR); Yong-Tak Kim, Yongin (KR); Sang-Hwan Cho, Yongin (KR); Yun-Ah Chung, Yongin (KR); Seung-Yong Song, Yongin (KR); Jong-Hyuk Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 280 days.

(21) Appl. No.: 13/297,133

(22) Filed: Nov. 15, 2011

(65) Prior Publication Data

US 2012/0256201 A1    Oct. 11, 2012

(30) Foreign Application Priority Data

Apr. 5, 2011    (KR) .................. 10-2011-0031322

(51) Int. Cl.
*H01L 51/52* (2006.01)
*H01L 51/56* (2006.01)

(52) U.S. Cl.
CPC ........ *H01L 51/5256* (2013.01); *H01L 51/5268* (2013.01)

(58) Field of Classification Search
CPC . H01L 51/5256; H01L 51/5268; H01L 51/50; H01L 51/5262
USPC ........... 438/22, 26, 28, 38, 99, 623, 780–781, 438/789–790, 793–794; 257/40, 642, 759, 257/E23.107, E21.292, E51.001, E51.018, 257/E51.02, E51.002, E51.021, E51.022, 257/E51.038
See application file for complete search history.

(56) References Cited

U.S. PATENT DOCUMENTS 6,038,008 A *  3/2000  Kim et al. .............. 349/138
6,413,645 B1  7/2002  Graff et al.
(Continued)

FOREIGN PATENT DOCUMENTS

JP      2007-073355    3/2007
KR   10-2002-0080067   10/2002
(Continued)

OTHER PUBLICATIONS

"Which Fractal Parameter Contributes Most to Adhesion?," D.-L. Liu, J. Martin and N. A. Burnham, a Department of Physics, Worcester Polytechnic Institute, Worcester, MA, USA, Adhesion Aspects in MEMS/NEMS (2010) 45-58).*

(Continued)

*Primary Examiner* — Laura Menz
*Assistant Examiner* — Maliheh Malek
(74) *Attorney, Agent, or Firm* — Lewis Roca Rothgerber Christie LLP

(57) ABSTRACT

An OLED display includes: a substrate; an organic light emitting element formed on the substrate and including a first electrode, an emission layer, and a second electrode; and an encapsulation layer formed on the substrate while covering the organic light emitting element. The encapsulation layer includes an organic layer and an inorganic layer, and a protrusion and depression structure is formed in an interface between the organic layer and the inorganic layer.

7 Claims, 6 Drawing Sheets

(56) References Cited

U.S. PATENT DOCUMENTS

| | | | |
|---|---|---|---|
| 6,969,634 B2* | 11/2005 | Bao | 438/99 |
| 7,133,100 B2* | 11/2006 | Ahn | 349/138 |
| 7,205,565 B2* | 4/2007 | Im et al. | 257/40 |
| 7,473,932 B2* | 1/2009 | Cho et al. | 257/88 |
| 7,906,898 B2* | 3/2011 | Lee | 313/504 |
| 8,168,984 B2* | 5/2012 | Lin et al. | 257/76 |
| 8,455,282 B2* | 6/2013 | Kim et al. | 438/42 |
| 8,569,951 B2 | 10/2013 | Ryu et al. | |
| 2004/0263740 A1* | 12/2004 | Sakakura et al. | 349/138 |
| 2005/0026454 A1* | 2/2005 | Konishi et al. | 438/778 |
| 2005/0175831 A1* | 8/2005 | Kim | B32B 33/00 428/323 |
| 2007/0159094 A1* | 7/2007 | Oh et al. | 313/512 |
| 2007/0166851 A1* | 7/2007 | Tran et al. | 438/22 |
| 2007/0290607 A1* | 12/2007 | Okada et al. | 313/504 |
| 2007/0291200 A1* | 12/2007 | Tashiro et al. | 349/112 |
| 2008/0157065 A1* | 7/2008 | Krishnamoorthy et al. | 257/40 |
| 2008/0305360 A1* | 12/2008 | Han et al. | 428/690 |
| 2009/0137178 A1* | 5/2009 | Sakakura et al. | 445/25 |
| 2009/0202743 A1* | 8/2009 | Schaepkens et al. | 427/576 |
| 2010/0136728 A1* | 6/2010 | Horng et al. | 438/29 |
| 2010/0320909 A1* | 12/2010 | Izumi | 315/51 |
| 2011/0114931 A1* | 5/2011 | Lee et al. | 257/40 |
| 2011/0121355 A1* | 5/2011 | Bae et al. | 257/100 |
| 2011/0121469 A1* | 5/2011 | Blander et al. | 257/788 |
| 2011/0171764 A1 | 7/2011 | Toonen et al. | |
| 2011/0175073 A1* | 7/2011 | Chang | 257/40 |
| 2011/0272682 A1* | 11/2011 | Blizzard et al. | 257/40 |
| 2011/0277653 A1* | 11/2011 | Nguyen | 101/453 |
| 2012/0139000 A1* | 6/2012 | Lee et al. | 257/99 |
| 2012/0155093 A1* | 6/2012 | Yamada et al. | 362/311.01 |
| 2012/0199872 A1 | 8/2012 | Chen et al. | |
| 2012/0208306 A1 | 8/2012 | Haas et al. | |
| 2012/0256202 A1* | 10/2012 | Lee et al. | 257/88 |
| 2012/0286245 A1* | 11/2012 | Levermore et al. | 257/40 |
| 2012/0326131 A1 | 12/2012 | Han | |
| 2012/0326192 A1* | 12/2012 | Van Slyke et al. | 257/98 |
| 2013/0175710 A1* | 7/2013 | Sakakura et al. | 257/787 |
| 2013/0210199 A1* | 8/2013 | Chen | C23C 16/26 438/127 |
| 2013/0244079 A1* | 9/2013 | Mandlik et al. | 429/122 |
| 2013/0334511 A1* | 12/2013 | Savas | H01L 51/56 257/40 |
| 2014/0087162 A1* | 3/2014 | Ma | B32B 27/28 428/216 |
| 2015/0054422 A1* | 2/2015 | Koo | H04B 33/0872 315/250 |

FOREIGN PATENT DOCUMENTS

| | | |
|---|---|---|
| KR | 10-2005-0048133 A | 5/2005 |
| KR | 10-2005-0117255 A | 12/2005 |
| KR | 10-2006-0031487 | 4/2006 |
| KR | 10-2008-0087257 A | 10/2008 |
| KR | 10-2010-0027902 A | 3/2010 |

OTHER PUBLICATIONS

U.S. Notice of Allowance dated Oct. 27, 2014, for cross reference U.S. Appl. No. 13/298,118, (7 pages).

* cited by examiner

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2011-0031322, filed in the Korean Intellectual Property Office on Apr. 5, 2011, the entire content of which is incorporated herein by reference.

BACKGROUND

1. Field

The described technology relates generally to an organic light emitting diode (OLED) display. More particularly, the described technology relates generally to an OLED display having an encapsulation layer to protect an organic light emitting element from external moisture and oxygen, and a manufacturing method thereof.

2. Description of Related Art

Organic light emitting diode displays are typical displays that emit light by themselves and have small thickness and weight, because they do not need independent light sources, and also have excellent or desired characteristics, such as small power consumption, high luminance, and high response speed.

A plurality of organic light emitting elements, each formed of a first electrode, a second electrode, and a light emission layer disposed between the first and second electrodes, are disposed in a display portion of the OLED display. Since a display function and a life-span characteristic are deteriorated when the organic light emitting element is exposed to external moisture and oxygen, an encapsulation layer is formed on the display portion to seal the display portion. The encapsulation layer may have a multilayer structure formed by alternatively layering organic layers and inorganic layers several times.

The above information disclosed in this Background section is only for enhancement of understanding of the background of the described technology and therefore it may contain information that does not form the prior art that is already known in this country to a person of ordinary skill in the art.

SUMMARY

The described technology is directed toward an effort to provide an organic light emitting diode (OLED) display with an encapsulation layer having an improved sealing function by improving structures of organic and inorganic layers forming the encapsulation layer, and a manufacturing method thereof.

An OLED display according to an exemplary embodiment includes: a substrate; an organic light emitting element formed on the substrate and including a first electrode, an emission layer, and a second electrode; and an encapsulation layer formed on the substrate while covering the organic light emitting element. The encapsulation layer includes an organic layer and an inorganic layer, and a protrusion and depression structure is formed in an interface between the organic layer and the inorganic layer.

The protrusion and depression structure may have a root mean square (RMS) roughness in a range between 30 Å to 100 nm. The surface roughness of the protrusion and depression structure may have a maximum height (Rmax) in a range between 50 Å to 200 nm.

The protrusion and depression structure may be formed in a surface of the organic layer, and the inorganic layer may be formed on the organic layer. The surface roughness of the protrusion and depression structure may include a root mean square (RMS) roughness in a range between 30 Å to 100 nm and a maximum height (Rmax) in a range between 50 Å to 200 nm.

The organic layer and the inorganic layer may be respectively provided in plural, and the protrusion and depression structure may be formed at each interface where the inorganic layer is layered on the organic layer.

The organic layer may include at least one material selected from a group consisting of a carbide-based material, a carbonate-based material, an acryl-based resin, a methacryl-based resin, polyisoprene, a vinyl-based resin, an epoxy-based resin, a urethane-based resin, a cellulous-based resin, and a perylene-based resin.

The inorganic layer may include at least one material selected from a group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

A manufacturing method of an OLED display according to another exemplary embodiment includes: forming an organic light emitting element to include a first electrode, an emission layer, and a second electrode on a substrate and forming an encapsulation layer on the organic light emitting element. The forming of the encapsulation layer includes forming an organic layer, forming a protrusion and depression structure in a surface of the organic layer by dry-etching the surface of the organic layer, and forming an inorganic layer on the organic layer where the protrusion and depression structure is formed.

The protrusion and depression structure may have a root mean square (RMS) roughness in a range between 30 Å to 100 nm and a surface roughness maximum height (Rmax) in a range between 50 Å to 200 nm.

In the dry-etching process, at least one gas selected from a group consisting of $SiF_4$, $CF_4$, $C_3F_8$, $C_2F_6$, $CHF_3$, $CClF_3$, $O_2$, $NF_3$, and $SF_6$ may be used as a process gas.

The organic layer may be formed utilizing a deposition method in a chamber of the PECVD equipment, and the dry-etching may be continuously performed in the chamber after the organic layer is formed.

The dry-etching may be performed in the plasma etching equipment, and one of ion-beam etching, inductively coupled plasma etching, and reactivity ion etching may be employed for the dry-etching. Also, a radio frequency power in a range between 10 mW to 2,000 W and a process pressure in a range between 0.1 torr to 10 torr may be applied for the dry-etching process.

The OLED display can prevent a layer fall-off phenomenon by enhancing a bonding force between an organic layer and an inorganic layer that form an encapsulation, and can improve a sealing function of the encapsulation by suppressing penetration of external moisture and oxygen along an interface between the organic and inorganic layers. Further, the OLED display can enhance light extraction efficiency by reducing internal reflection in the interface between the organic and inorganic layers.

DETAILED DESCRIPTION

Figure 1:
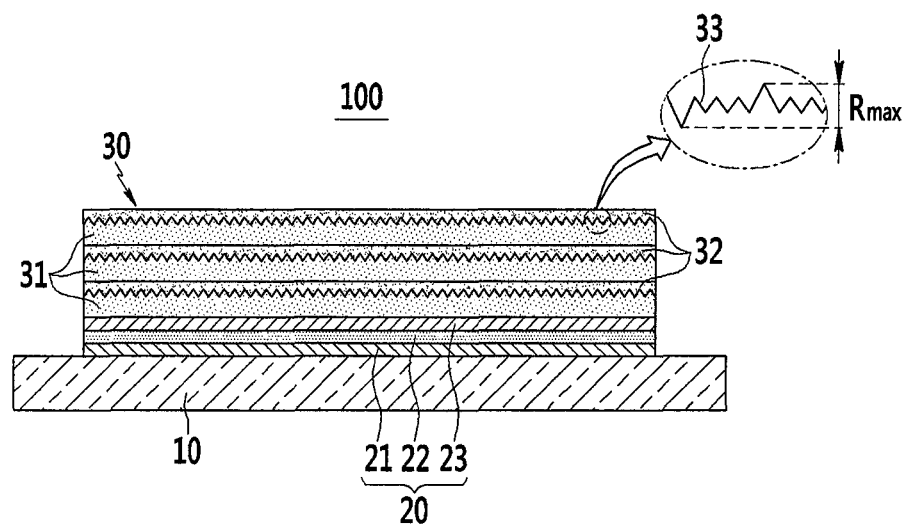
FIG. 1 is a schematically cross-sectional view of an OLED display according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, regions, etc., are exaggerated for clarity. It will be understood that when an element such as a layer, film, region, or substrate is referred to as being "on" another element, it can be directly on the other element or one or more intervening elements may also be present therebetween. By contrast, it will be understood that when an element is referred to as being "directly on" another element, intervening elements are not present.

Figure 2:
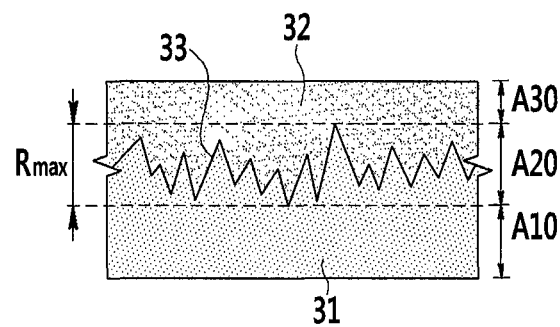
FIG. 2 is a partially enlarged view of an encapsulation layer of FIG. 1.

FIG. 1 is a schematically cross-sectional view of an organic light emitting diode (OLED) display according to an exemplary embodiment, and FIG. 2 is a partially enlarged view of an encapsulation layer of FIG. 1.

Referring to FIG. 1 and FIG. 2, an OLED display 100 includes a substrate 10, an organic light emitting element 20 formed on the substrate 10, and an encapsulation layer 30 formed on the substrate 10 while covering the organic light emitting element 20. The organic light emitting element 20 includes a first electrode 21, an emission layer 22, and a second electrode 23. The encapsulation layer 30 includes an organic layer 31 and an inorganic layer 32, and a protrusion and depression structure 33 (having protrusions and depressions) is formed at a boundary between the organic layer 31 and the inorganic layer 32.

The substrate 10 may be a glass substrate or a plastic substrate. The substrate 10 may be formed with a glass or plastic material having excellent, desired or suitable mechanical strength, thermal stability, transparency, surface flatness, and water resistance. A barrier layer that blocks penetration of moisture and oxygen may also be disposed on the substrate 10. The barrier layer may be formed of one inorganic layer and one organic layer or formed by multiple layerings of the inorganic layers and the organic layers.

The organic light emitting element 20 is disposed on the substrate 10. The organic light emitting element 20 has a structure in which the first electrode 21, the emission layer 22, and the second electrode 23 are layered. One of the first electrode 21 and the second electrode 23 functions as a hole injection electrode and the other functions as an electron injection electrode.

The first electrode 21 and the second electrode 23 may be a transparent electrode, a partially transparent electrode, or a reflective electrode. When the first electrode 21 is a transparent electrode and the second electrode 23 is a reflective electrode, light from the emission layer 22 is reflected by the second electrode 23 and emitted to the outside after passing through the first electrode 21 and the substrate 10. On the contrary, when the first electrode 21 is a reflective electrode and the second electrode 23 is a transparent electrode, light from the emission layer 22 is reflected by the first electrode 21 and emitted to the outside after passing through the second electrode 23 and the encapsulation layer 30.

In addition to the emission layer 22, at least one of a hole injection layer (HIL), a hole transport layer (HTL), an electron transport layer (ETL), and an electron injection layer (EIL) may be further formed between the first and second electrodes 21 and 23. When a driving voltage is applied to the first electrode 21 and the second electrode 23, electrons and holes are injected to the emission layer 22 and exitons are generated from combination of the injected electrons and holes, and light is emitted when the excitons drop from the excited stated to the ground state.

The organic light emitting elements are disposed in a display portion of the substrate 10. Each of the organic light emitting elements is connected to a driving circuit including a thin film transistor such that light emission of the organic light emitting element is controlled by the driving circuit. In FIG. 1, the driving circuit is omitted for convenience driving circuit description, and one organic light emitting element is illustrated instead of illustrating the plurality of organic light emitting elements.

The encapsulation layer 30 protects the organic light emitting element 20 from external moisture and oxygen by sealing the organic light emitting element 20. The encapsulation layer 30 includes a plurality of organic layers 31 and a plurality of inorganic layers 32, and is formed by alternately layering the respective organic layers 31 and the respective inorganic layers 32. In general, the inorganic layers 32 suppress penetration of moisture and oxygen, and the organic layers fill micro cracks and pin holes.

An interface of the organic layer 31 and the inorganic layer 32 is provided in plural in the encapsulation layer 30. A protrusion and depression structure 33 (having protrusions and depressions) is formed in one of the plurality of interfaces. The protrusion and depression structure 33 has an irregular pattern rather than having a concave groove or a protrusion formed in a predetermined shape. The protrusion and depression structure 33 may be formed by employing a dry etching method.

The protrusion and depression structure 33 has a root mean square (RMS) roughness in a range between 30 Å to 100 nm or a surface roughness having the maximum height (Rmax) that is in a range between 50 Å to 200 nm. The RMS roughness refers to a roughness value acquired by using an RMS method generally used in the field of statistics, and the maximum height (Rmax) refers to a vertical distance between the highest peak and the lowest hollow of the protrusion and depression structure 33.

The protrusion and depression structure 33 may be formed in a surface of the organic layer 31. That is, the organic layer 31 is formed using a heat treatment or deposition method after coating, and then the surface roughness of the organic layer 31 may be increased by dry etching the surface of the organic layer 31.

In addition, an inorganic layer 32 is formed by depositing an inorganic material on the organic layer 31 to fill gaps between the hollows of the protrusion and depression structure 33. As described, wettability of the inorganic layer 32 with respect to the organic layer 31 is enhanced by the protrusion and depression structure 33 so that the inorganic layer 32 can be further robustly attached on the organic layer 31. Since the organic layer 31 and the inorganic layer 32 contact each other, interposing a rough interface therebetween, no definite interface is observed between the organic layer 31 and the inorganic layer 32.

In observation of a cross-section of the encapsulation layer 30, the encapsulation layer 30 is divided into an organic material area A10 formed of only an organic material, a mixed area A20 where the organic material and an inorganic material co-exist, and an inorganic material area A30 formed of only an inorganic material. The organic material area A10, the mixed area A20, and the inorganic material area A30 are arranged along a thickness direction (vertical direction of FIG. 2) of the encapsulation layer 30. The thickness of the mixed area A20 is equivalent to (or the same as) the surface roughness maximum height (Rmax) of the protrusion and depression structure 33.

When the organic layer is formed and the inorganic layer is formed on the organic layer without performing surface treatment, the organic layer and the inorganic layer have a definite interface between the organic layer and the inorganic layer and thus they may be separated from each other, thereby causing a layer falling-off phenomenon. In addition, moisture and oxygen included in the external air penetrate into the encapsulation layer along the interface between the organic layer and the inorganic layer such that the sealing function of the encapsulation layer is deteriorated. In this case, the encapsulation layer has excellent sealing effect along the thickness direction thereof, but the sealing effect is decreased along a plane direction of the encapsulation layer. In this case, the plane direction implies a direction that is parallel with the organic layer or the surface of the organic layer.

However, in the present exemplary embodiment, the adherence between the organic layer 31 and the inorganic layer 32 is improved by the protrusion and depression structure 33 such that the layer falling-off phenomenon can be prevented or reduced. In addition, since the protrusion and depression structure 33 functions to block the penetration of moisture and oxygen, the sealing effect of the encapsulation layer 30 along the plane direction thereof is enhanced, thereby improving the sealing performance. That is, in the present exemplary embodiment, the sealing performance of the encapsulation layer 30 can be excellently realized along the thickness and plane directions.

As previously described, the protrusion and depression structure 33 may have root mean square (RMS) roughness in a range between 30 Å to 100 nm or surface roughness having the maximum height (Rmax) that is in a range between 50 Å to 200 nm.

In one embodiment, when the RMA roughness of the protrusion and depression structure 33 is less than 30 Å or the maximum height (Rmax) is less than 50 Å, the adherence between the organic layer 31 and the inorganic layer 32 is not strong enough to prevent the layer falling-off phenomenon and the sealing function of the encapsulation layer 30 is deteriorated along the plane direction. In another embodiment, when the RMS roughness of the protrusion and depression structure 33 exceeds 100 nm or the maximum height (Rmax) exceeds 200 nm, the organic layer 31 is over-etched so that a driving characteristic of the organic light emitting element 20 is deteriorated, and an additional process (e.g., photolithography, etc.) for easing the excessive roughness is required, thereby causing the process to be complicated.

Further, the organic layer 31 and the inorganic layer 32 cause a refractive index to be changed due to the protrusion and depression structure 33 such that light efficiency can be improved. In case of a front emission type OLED display, when the light from the emission layer 22 passes through the encapsulation layer 30, internal reflection at the rough interface of the organic and inorganic layers 31 and 32 can be reduced so that the light extraction efficiency can be improved. Further, when external light is incident on the encapsulation layer, reflection of the external light can be suppressed by refracting the external light at the rough interface between the organic layer 31 and the inorganic layer 32. The light extraction efficiency refers to luminance improvement of the screen, and the suppression of reflection of the external light improves contrast of the screen.

The organic layer 31 has a refractive index in a range between 1.2 to 2.0, and the inorganic layer 32 has a refractive index in a range between 1.3 to 2.2. A refractive index difference between the organic layer 31 and the inorganic layer 32 is set to be higher than 0.1 to improve light extraction efficiency, and the light extraction efficiency can be increased as the refractive index difference between the organic and inorganic layers 31 and 32 is increased.

The organic layer 31 may include at least one of a carbide-based material, a carbonate-based material, an acryl-based resin, a methacryl-based resin, polyisoprene, a vinyl-based resin, an epoxy-based resin, a urethane-based resin, a cellulous-based resin, and a perylene-based resin. The plurality of organic layers 31 may include the same material or different materials. The organic layer 31 may have a rough surface through a plasma etching process. The plasma etching process will be described later in further detail.

The inorganic layer 32 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The plurality of inorganic layers 32 may include the same material or different materials.

FIG. 1 exemplarily illustrates that the encapsulation layer 30 includes three organic layers 31 and three inorganic layers 32, and the protrusion and depression structure 33 having the surface roughness included in the above-stated range is formed at each interface between the organic layer 31 and the inorganic layer 32. However, the number of the protrusion and depression structures 33 and the locations of the organic layers 31 and the inorganic layers 32 may be variously and suitably changed.

A manufacturing method of an OLED display according to the present exemplary embodiment will now be described.

A manufacturing method of the OLED display 100, according to the present exemplary embodiment, includes forming the organic light emitting element 20 including the first electrode 21, the emission layer 22, and the second electrode 23 on the substrate 10 and forming the encapsulation layer 30 on the organic light emitting element 20. The forming of the encapsulation layer 30 includes a first step for forming the organic layer 31, a second step for forming the protrusion and depression structure 33 in the surface of the organic layer 31 by dry-etching the surface of the organic layer 31, and a third step for forming the inorganic layer 32 on the organic layer 31 where the protrusion and depression structure 33 is formed.

Figure 3A:
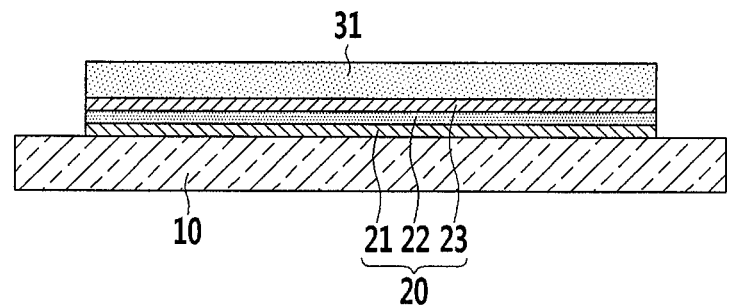
FIG. 3A to FIG. 3C are schematically cross-sectional views for describing a manufacturing method of an OLED display according to an exemplary embodiment.
Figure 3B:
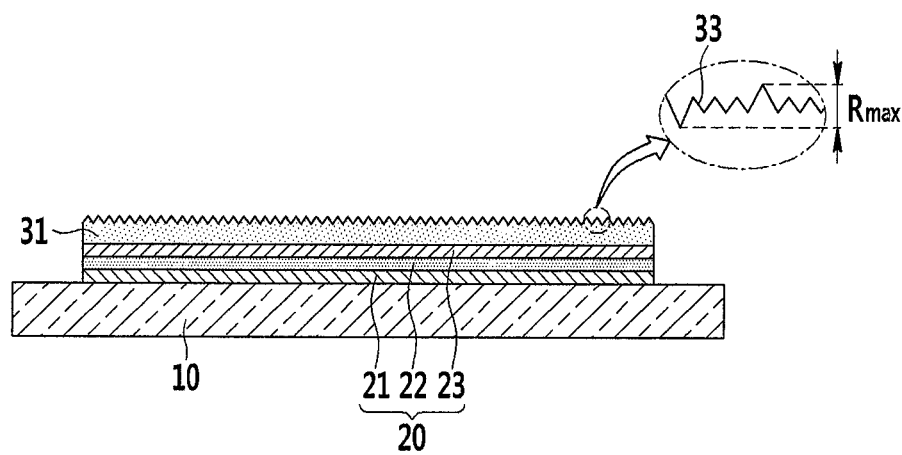
Figure 3C:
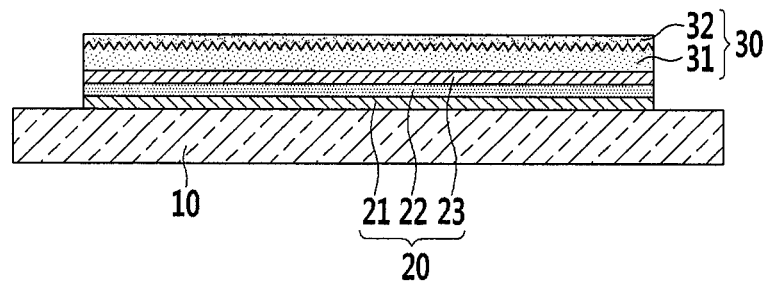

FIG. 3A to FIG. 3C are schematically cross-sectional views for describing a manufacturing method of an OLED display according to an exemplary embodiment.

Referring to FIG. 3A, an organic light emitting element 20 is formed on a substrate 10. The organic light emitting element 20 includes a first electrode 21, an emission layer 22, and a second electrode 23. The first electrode 21, the emission layer 22, and the second electrode 23 are formed with materials and methods that are known to the typical OLED display field, and therefore no further description will be provided.

A barrier layer may also be disposed between the substrate 10 and the organic light emitting element 20, and a driving circuit including a thin film transistor is formed on the substrate 10. The driving circuit is connected with the organic light emitting element 20 and controls driving of the organic light emitting element 20.

Subsequently, an organic layer 31 is formed to cover the organic light emitting element 20 (first step). The organic layer 31 may be formed through a heat treatment or deposition method after coating an organic material. The thickness of the organic layer 31 may be 0.01 μm to 5 μm.

Referring to FIG. 3B, a protrusion and depression structure 33, having surface roughness of which RMS roughness is in a range between 30 Å to 100 nm and a maximum height (Rmax) is in a range between 50 Å to 200 nm, is formed by dry-etching a surface of the organic layer 31 (second step). The dry-etching may be realized using a plasma enhanced chemical vapor deposition (PECVD) equipment or a plasma etching equipment.

When the organic layer 31 is formed by depositing the organic material in a chamber of the PECVD equipment, the surface of the organic layer 31 can be dry-etched through a continuous process in the same chamber by changing a process condition such as injection gas, pressure, and power. Plasma etching may be realized in another process chamber after forming the organic layer 31. Ion-beam etching, inductively coupled plasma etching, or reactivity ion etching may be used as the plasma etching.

At least one selected from a group consisting of $SiF_4$, $CF_4$, $C_3F_8$, $C_2F_6$, $CHF_3$, $CClF_3$, $O_2$, $NF_3$ and $SF_6$ may be used as the process gas for the dry-etching process. In addition, an inactive gas (i.e., Ar or such as $N_2$) that does not directly involve etching reaction may be further included to enhance etching reactivity or uniformity of etching.

For the dry-etching performed in the PECVD equipment, the reaction gas may include $NF_3$. For the ion-beam etching, the process gas may include at least one of $C_3F_8$, $CHF_3$, $CClF_3$, and $CF_4$. For the inductively coupled plasma etching, the process gas may include $O_2$. For the reactivity ion etching, the process gas may include at least one of $SiF_4$, $CF_4$, $C_3F_8$, $C_2F_6$, $CHF_3$, $CClF_3$, $O_2$, $NF_3$, and $SF_6$.

Radio frequency power included in a range between 10 mW to 2,000 W and a process pressure included in a range between 0.1 torr to 10 torr may be applied for the plasma etching. When the above-stated conditions are satisfied, etching uniformity can be acquired and deterioration of a driving characteristic of the organic light emitting element can be suppressed.

A protrusion and depression structure 33 is formed in the surface of the organic layer 31 through the dry-etching, and the protrusion and depression structure 33 has surface roughness of which a root mean square (RMS) is in a range between 30 Å to 100 nm and a maximum height is in a range between 50 Å to 200 nm.

Figure 4:
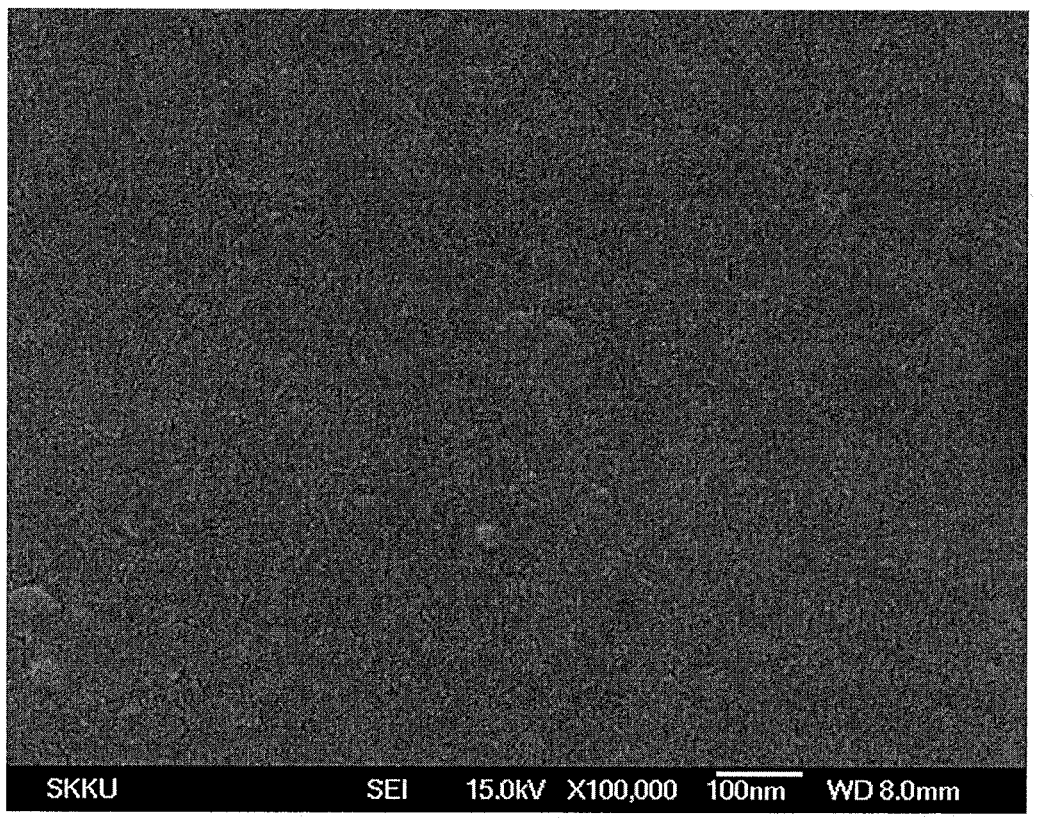
FIG. 4 is an SEM photo of a surface of an organic layer according to an exemplary embodiment processed through a step shown in FIG. 3B.
Figure 5:
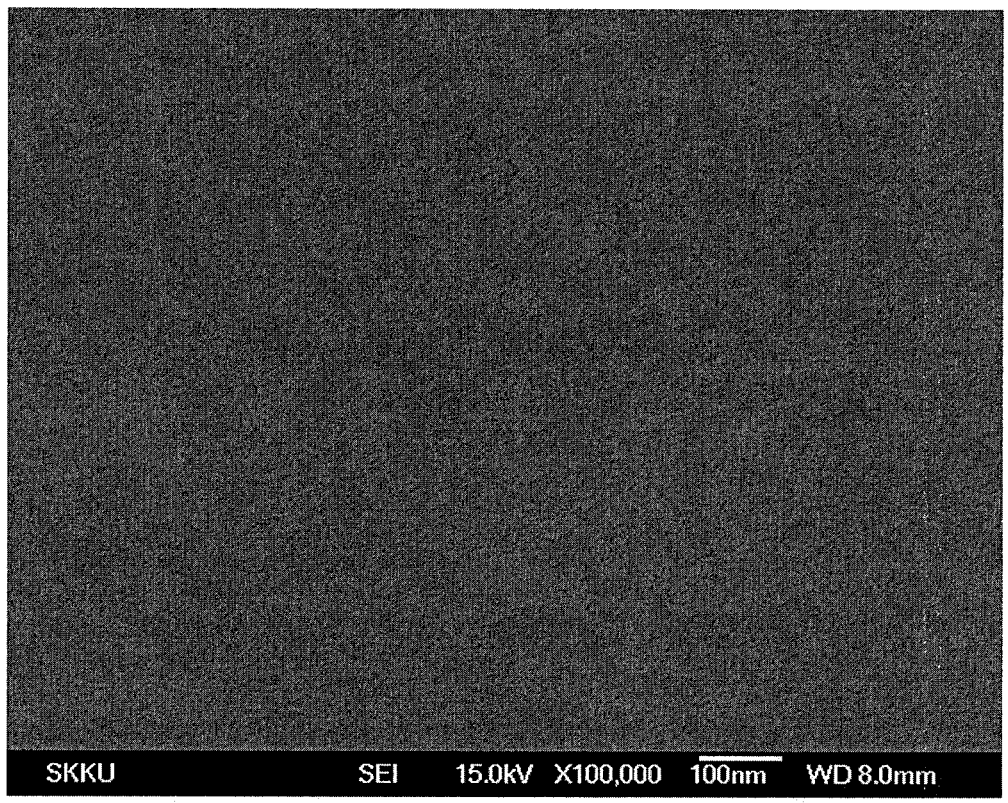
FIG. 5 is an SEM photo of a surface of an organic layer according to a comparative example that is not plasma etched.

In the first step, a polypethylemethacrylate resin is included as an organic material and the organic layer is dry-etched in the second step. FIG. 4 is an SEM photo of such an organic layer. FIG. 5 is an SEM photo of an organic layer according to a comparative example. The organic layer of the comparative example is formed in the same condition of the exemplary embodiment, except that dry-etching is not performed.

The organic layer according to the comparative example shown in FIG. 5 has a smooth surface of which an RMS roughness and a surface roughness maximum height (Rmax) are about several Å, and the organic layer according to the exemplary embodiment shown in FIG. 4 has a rough surface, that is, a protrusion and depression structure 133.

Referring to FIG. 3C, the inorganic layer 32 is formed on the organic layer 31 such that gaps between hollows in the surface of the organic layer 31 are filled with an inorganic material (third step). The inorganic layer 32 may be formed using a deposition or sputtering method. Accordingly, the organic layer 31 and the inorganic layer 32 contact each other, interposing a rough interface therebetween, and realize an excellent adherence performance. The formed encapsulation layer 30, including the plurality of organic layers 31 and the plurality of inorganic layers 32, is formed by repeating at least once the first to third steps (refer to FIG. 1).

Figure 6:
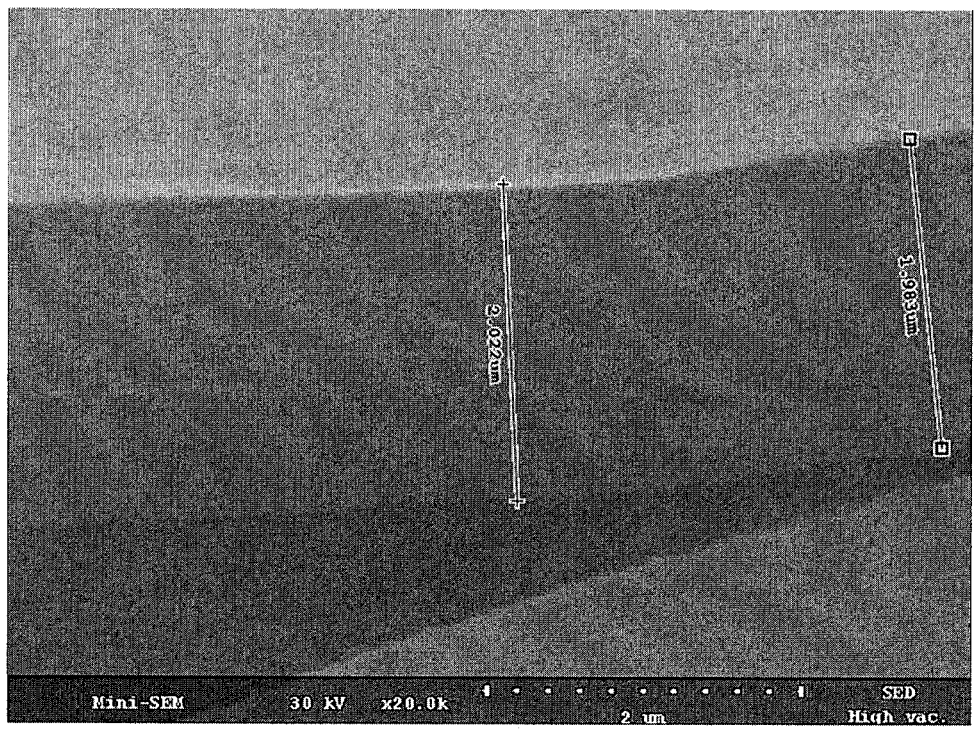
FIG. 6 is an SEM photo of a cross-section of the encapsulation layer according to the present exemplary embodiment.
Figure 7:
FIG. 7 is an SEM photo of a cross-section of an encapsulation layer according to a comparative example.

FIG. 6 is an SEM photo of a cross-section of the encapsulation layer according to a present exemplary embodiment, and FIG. 7 is an SEM photo of an encapsulation layer according to a comparative example. The encapsulation layer of the comparative example is formed in the same condition of the exemplary embodiment, except that plasma-etching is not performed.

In the encapsulation layer of the comparative example of FIG. 7, an interface between an organic layer and an inorganic layer is definite and a layer falling-off phenomenon is generated and thus the encapsulation layer is partially damaged. On the other hand, the encapsulation layer according to the exemplary embodiment of FIG. 6 does not have a definite interface between the organic layer and the inorganic layer due to roughness of the interface, and the organic layer and the inorganic layer are firmly adhered to each other without having the layer falling-off phenomenon. Two vertical lines shown in FIG. 6 are provided to indicate the entire thickness of the encapsulation.

The OLED display 100, provided with the above-stated encapsulation layer 30 according to the present exemplary embodiment can suppress the layer falling-off phenomenon of the encapsulation layer 30, can enhance a sealing function by blocking penetration of moisture and oxygen to the organic light emitting element 20, and can improve display quality by reducing reflection of internal and external lights.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of certain symbols>

| | |
|---|---|
| 100: OLED display | 10: substrate |
| 20: organic light emitting element | 21: first electrode |
| 22: emission layer | 23: second electrode |
| 30: encapsulation layer | 31: organic layer |
| 32: inorganic layer | 33: protrusion and depression structure |

What is claimed is:

1. An organic light emitting diode (OLED) display comprising:
   a substrate;
   an organic light emitting element on the substrate and comprising a first electrode, an emission layer, and a second electrode; and
   an encapsulation layer on the substrate while covering the organic light emitting element,
   wherein the encapsulation layer comprises alternately stacked organic layers and inorganic layers, wherein a protrusion and depression structure, with an irregular pattern, is formed in interfaces between the organic layers and the inorganic layers, wherein the protrusion and depression structure has a root mean square (RMS) roughness in a range between 30 Å to 1000 Å, wherein each of the organic layers has a refractive index between 1.2 and 2.0, wherein each of the inorganic layers has a refractive index between 1.3 and 2.2, wherein the protrusion and depression structure is formed in a surface of the organic layer, wherein the inorganic layer is formed on the organic layer, and wherein the protrusion and depression structure consists of the same material as the organic layer.

2. The OLED display of claim 1, wherein a surface roughness of the protrusion and depression structure has a maximum height (Rmax) in a range between 50 Å to 200 nm.

3. The OLED display of claim 1, wherein a surface roughness of the protrusion and depression structure has a maximum height (Rmax) in a range between 50 Å to 200 nm.

4. The OLED display of claim 1, wherein the organic layer and the inorganic layer are respectively provided in plural, and the protrusion and depression structure is formed at each interface where the inorganic layer is layered on the organic layer.

5. The OLED display of claim 1, wherein the organic layer comprises at least one material selected from a group consisting of a carbide-based material, a carbonate-based material, an acryl-based resin, a methacryl-based resin, polyisoprene, a vinyl-based resin, an epoxy-based resin, a urethane-based resin, a cellulous-based resin, and a perylene-based resin.

6. The OLED display of claim 1, wherein the inorganic layer comprises at least one material selected from a group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

7. The OLED display of claim 1, wherein a refractive index difference between the organic layer and the inorganic layer is higher than 0.1.

* * * * *